United States Patent [19]
Iannuzzi et al.

[11] 4,176,443
[45] Dec. 4, 1979

[54] METHOD OF CONNECTING SEMICONDUCTOR STRUCTURE TO EXTERNAL CIRCUITS

[75] Inventors: Giulio Iannuzzi; Carlo C. deMartiis, both of Milan; Vittorio Del Bo, Monza; Luciano Gandolfi, Corsico, all of Italy

[73] Assignee: SGS-ATES Componenti Elettronici S.p.A., Agrate Brianza, Italy

[21] Appl. No.: 957,331

[22] Filed: Nov. 3, 1978

Related U.S. Application Data

[63] Continuation-in-part of Ser. No. 884,498, Mar. 8, 1978, abandoned.

[30] Foreign Application Priority Data

Mar. 8, 1977 [IT] Italy ............................. 21021 A/77

[51] Int. Cl.² ............................................. B01J 17/00
[52] U.S. Cl. ................................ 29/589; 228/180 A; 29/628; 357/71
[58] Field of Search .................... 29/589, 590, 628; 357/71; 228/180 A

[56] References Cited

U.S. PATENT DOCUMENTS

| | | | |
|---|---|---|---|
| 3,926,747 | 12/1975 | Newby | 357/71 |
| 4,009,058 | 2/1977 | Mills | 357/71 |
| 4,042,954 | 8/1977 | Harris | 29/589 |

*Primary Examiner*—W. C. Tupman
*Attorney, Agent, or Firm*—Karl F. Ross

[57] ABSTRACT

A silicon wafer, having a front surface with disjointed contact areas and a uniform rear surface, is provided at the contact areas of its front surface with respective pads each comprising a base layer of aluminum, a first intermediate layer of chromium or titanium, a second intermediate layer of nickel and an outer layer of gold or palladium. The rear surface is covered with a base layer of gold (or of a gold/arsenic alloy in the case of N-type silicon), a first intermediate layer of chromium, a second intermediate layer of nickel and an outer layer of gold or palladium to which a film of low-melting bonding agent (lead/tin solder) is applied. After testing and elimination of unsatisfactory wafer sections, the remaining sections are separated into dies placed on a conductive substrate; an extremity of a respective terminal lead, encased in a similar bonding agent, is then placed on the outer layer of each contact pad. All soldering operations are simultaneously performed in a furnace.

7 Claims, 1 Drawing Figure

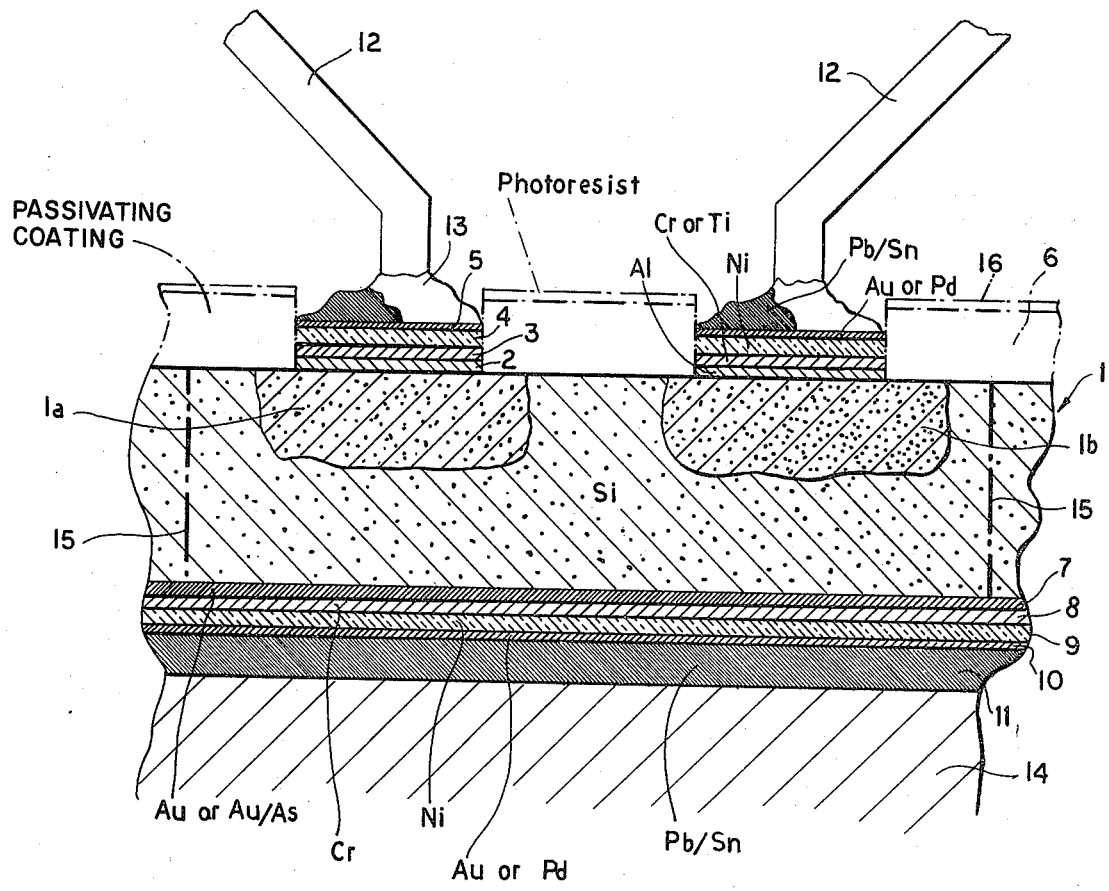

METHOD OF CONNECTING SEMICONDUCTOR STRUCTURE TO EXTERNAL CIRCUITS

CROSS-REFERENCE TO RELATED APPLICATION

This is a continuation in part of our copending application Ser. No. 884,498 filed Mar. 8, 1978, now abandoned.

FIELD OF THE INVENTION

Our present invention relates to a method of establishing connections between a crystalline semiconductor structure, specifically a silicon body, and external circuitry.

BACKGROUND OF THE INVENTION

Transistors and other semiconductor components are conventionally assembled in so-called packages in which the various zones of each silicon body are soldered to respective external conductors. Generally, one major body surface (referred to hereinafter as the front surface) is provided with a plurality of metallic pads, overlying disjointed contact areas of that surface, whereas the opposite surface (referred to hereinafter as the rear surface) is of essentially uniform character and is completely metallized. Low-melting alloys, e.g. of lead or tin, are suitable bonding agents for soldering the various pads of the front surface to individual terminal leads and the metallic coating of the rear surface to a conductive substrate, e.g. a copper plate serving as a heat sink.

Especially for power amplifiers and similar devices designed to handle currents above 2 amps, aluminum is an excellent contact material forming low-ohmic junctions with a doped silicon substrate of N-type or P-type conductivity having the usual impurity concentrations. Being an inexpensive metal and easy to apply, aluminum is advantageously used on the frontal contact areas of a silicon body. This metal, however, is not bondable by a low-melting alloy of the type referred to.

OBJECT OF THE INVENTION

The object of our present invention is to provide a convenient method of conductively connecting the various contact zones of a silicon body, including its disjointed frontal areas and its rear surface, to respective external conductors with utilization of aluminum as a contact material at these frontal areas.

SUMMARY OF THE INVENTION

In accordance with our present invention, a conductive pad is built up on each frontal contact area by successively depositing thereon a base front layer of aluminum, a first intermediate front layer of chromium or titanium, a second intermediate front layer of nickel, and an outer front layer of a noble metal, specifically gold or palladium. The rear surface of the silicon body is successively coated with a base rear layer of gold (with P-type doped silicon) or of a gold/arsenic alloy (with N-type doped silicon), a first intermediate rear layer of chromium, a second intermediate rear layer of nickel and an outer rear layer of a noble metal as defined above. Next, a low-melting metallic bonding agent such as a 60:40 lead/tin alloy is deposited on each of the outer layers whereupon all these outer layers are simultaneously soldered to respective external conductors by the melting of the bonding agent in a furnace.

Part of the bonding agent may be distributed over the gold or palladium layer of the rear surface as a continuous film, prior to soldering. On the front pads, however, we prefer to retain the bonding agent initially as a coating or cladding on the extremities of the respective terminal leads to be soldered thereto.

All the layers, including the film solder, are preferably vapor-deposited in a vacuum.

BRIEF DESCRIPTION OF THE DRAWING

The above and other features of our invention will now be described in detail with reference to the accompanying drawing the sole FIGURE of which is a somewhat diagrammatical cross-sectional view of part of a silicon wafer provided with external connections in accordance with this invention.

SPECIFIC DESCRIPTION

The crystalline semiconductor structure shown in the drawing comprises a silicon body 1 originally forming part of a larger wafer of a given conductivity type (e.g. N) provided near its upper or front surface with a number of insular zones 1a, 1b of opposite conductivity type (e.g. P). Only two such insular zones are included in the illustrated wafer portion which may be referred to as a "die". If the unit formed by this portion is to operate as a transistor, zones 1a and 1b may constitute an emitter and a base, respectively.

The exposed contact area of each zone 1a, 1b is overlain by a base layer 2 of aluminum on which there are stacked three further layers, namely a first intermediate layer 3 of chromium or titanium having a thickness of about 300 to 800 Å, a second intermediate layer 4 of nickel with a minimum thickness of 4,000 Å, and an outer later 5 of gold or palladium at least 200 Å thick, During their buildup, as more fully described hereinafter, the several stacks 2–5 are separated from one another by a passivating layer 6 and an overlying heavy photoresist layer 16 as indicated in phantom lines. The height of the aluminum layer 2 may be about 10 to 20 Å.

The lower or rear surface of body 1 is coated with a base layer 7 having a thickness of at least 300 Å consisting of gold or gold/arsenic alloy, depending on the conductivity type of body 1 as discussed above, a first intermediate layer 8 of chromium having a thickness of 300 to 800 Å, a second intermediate layer 9 of nickel at least 4,000 Å thick, and an outer layer 10 of gold or palladium which has a thickness of at least 200 Å. The latter layer is coated with a heavier film 11 of low-melting solder, namely Pb/Sn alloy as mentioned above, having a thickness of at least 100,000 Å or 10μ.

Two terminal leads 12, with lower extremities encased in blobs 13 of the same kind of solder as film 11, rest on the outer layers 5 of the pads overlying the contact areas of zones 1a and 1b. Film 10 is in direct contact with a conductive substrate 14 (e.g. a copper plate) also forming part of an external circuit. The connections between layers 5 and leads 12, on the one hand, and between layer 10 and substrate 14, on the other hand, are completed simultaneously in a furnace on all the dies supported by substrate 14 whereby a package is formed.

We shall now give a specific example for producing the package diagrammatically illustrated in the drawing.

A silicon wafer 1, with different conductivity zones established therein by the diffusion of impurities, is coated on its front surface with a continuous aluminum layer 2 deposited under vacuum. Next, unneeded portions of layer 2 are removed by conventional techniques including the steps of covering the aluminum with a photosensitive masking layer, selectively illuminating the masking layer, washing off the unexposed portions of that layer and etching away the underlying aluminum layer 2, with subsequent removal of the remaining parts of the masking layer. There follows a passivation of the entire front surface, as by vapor-depositing a coating (layer 6) of phosphorus-doped silicon oxide thereon. Next, a heavy photoresist layer 16 is deposited on this passivation layer 6 and, after selective illumination through a photographic mask by conventional photoengraving procedures, is washed away above the aluminum patches 2 together with the portions of the passivating coating overlying these patches.

This operation is followed by successive vapor depositions over the entire front surface, under vacuum at temperatures between 100° and 150° C., of Cr and Ti to form the layers 3, of Ni to form the layers 4, and of Au or Pd to form the layers 5. The remaining parts of the photoresist layer 16, indicated by phantom lines, can then be stripped off together with the portions of layers 3, 4 and 5 deposited thereon.

At this point, it will be convenient to machine the hitherto uncoated rear surface of wafer 1 to the desired thickness. Next, the base layer 7 of Au or Au/As is vapor-deposited on that surface under vacuum at a temperature of about 380° C. The following layers 8 of Cr, 9 of Ni and 10 of Au or Pd are successfully vapor-deposited thereafter under vacuum at temperature below 250° C., as is the film 11 of Pb/Sn.

Following remelting of the solder film 11 in a hydrogen atmosphere, the several units with zones 1a, 1b (e.g. transistors) can be individually tested for their electrical performance. These units are then separated at boundaries 15 by a so-called scribing operation and the wafer portions found defective are discarded. The properly functioning units or dies are next placed upon substrate 14 while the solder-enveloped tips of conductors 12 are brought into contact with the respective pads 2–5. The entire assembly or package is then introduced into a furnace to complete the electrical connections as already described.

We claim:

1. A method of establishing connections between a crystalline semiconductor structure and external circuitry, said semiconductor structure including a silicon body having a front surface with a plurality of disjointed contact areas and an essentially uniform rear surface, comprising the steps of:

building up a conductive pad on each of said contact areas by successively depositing thereon a base front layer of aluminum, a first intermediate front layer of a metal selected from the group which consists of chromium and titanium, a second intermediate front layer of nickel, and an outer front layer of a noble metal selected from the group which consists of gold and palladium;

successively coating said rear surface with a base rear layer of a conductive materials selected from the group which consists of gold and gold/arsenic alloys, a first intermediate rear layer of chromium, a second intermediate rear layer of nickel and an outer rear layer of said noble metal;

depositing a low-melting metallic bonding agent on each of said outer layers; and simultaneously soldering said outer layers to respective external conductors by melting said bonding agent in a furnace.

2. A method as defined in claim 1 wherein part of said bonding agent is deposited as a film on said rear layer prior to soldering.

3. A method as defined in claim 2 wherein all said layers and said film are formed by vapor deposition in vacuum.

4. A method as defined in claim 3 wherein the deposition of the intermediate and outer layers of said pad is carried out at a temperature between substantially 100° and 150° C., the deposition of the intermediate and outer layers and of said film on said rear surface being carried out at a temperature below 250° C.

5. A method as defined in claim 2 wherein the remainder of said bonding agent is adhered to extremities of a plurality of terminal leads each positioned on the outer layer of a respective conductive pad.

6. A method as defined in claim 1, 2 or 5 wherein said bonding agent is an alloy of lead and tin.

7. A method as defined in claim 1, 2 or 3, comprising the further steps of applying a passivating coating to said front surface after the deposition of said base front layer, removing said contact areas by photoengraving procedures to expose said front base layer preparatorily to the deposition of said intermediate and outer front layers, and thereafter eliminating the remainder of said photoresist layer together with the overlying portions of said intermediate and outer layers.

* * * * *